(12) United States Patent  (10) Patent No.: US 8,159,115 B2
Mizusawa  (45) Date of Patent: Apr. 17, 2012

(54) STACKED CRYSTAL RESONATOR

(75) Inventor: Shuichi Mizusawa, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 112 days.

(21) Appl. No.: 12/803,315

(22) Filed: Jun. 24, 2010

(65) Prior Publication Data

US 2010/0327706 A1    Dec. 30, 2010

(30) Foreign Application Priority Data

Jun. 30, 2009  (JP) ................................. 2009-155517
May 6, 2010   (JP) ................................. 2010-106078

(51) Int. Cl.
*H01L 41/08*   (2006.01)
*H01L 41/053*  (2006.01)

(52) U.S. Cl. ....................................... 310/344; 310/348

(58) Field of Classification Search .................. 310/340, 310/344, 348, 342, 311, 365, 363, 361, 320, 310/321, 364, 370; 333/187; *H01L 41/08, H01L 41/053*
See application file for complete search history.

(56) References Cited

U.S. PATENT DOCUMENTS

| | | | | |
|---|---|---|---|---|
| 4,027,181 | A * | 5/1977 | Moreillon et al. | 310/348 |
| 6,998,926 | B2 * | 2/2006 | Miyazaki et al. | 310/348 |
| 7,480,291 | B2 * | 1/2009 | Tripathi et al. | 370/389 |
| 2004/0217673 | A1 * | 11/2004 | Unno et al. | 310/348 |
| 2006/0238080 | A1 * | 10/2006 | Koyama et al. | 310/348 |

FOREIGN PATENT DOCUMENTS

| | | |
|---|---|---|
| JP | S57-125510 | 8/1982 |
| JP | S64-2288 | 1/1989 |
| JP | 05-183374 | 7/1993 |
| JP | 08-097674 | 4/1996 |
| JP | 08-265093 | 10/1996 |
| JP | 2001-267875 | 9/2001 |
| JP | 2006-094372 | 4/2006 |
| JP | 2007-258918 | 10/2007 |
| JP | 2009-118034 | 5/2009 |
| WO | WO2007/023685 | 3/2007 |

* cited by examiner

*Primary Examiner* — Thomas Dougherty
*Assistant Examiner* — Karen B Addison
(74) *Attorney, Agent, or Firm* — Scott D. Wofsy; Edwards Wildman Palmer LLP

(57) ABSTRACT

An object of the present invention is to provide a crystal resonator capable of maintaining its resonating characteristic and ensuring electrical connections between end surface electrodes using a simple method. Provided is a stacked crystal resonator including: a framed crystal plate, a frame section of which surrounds a resonating section, and to which both of these resonating section and frame section are connected by connecting sections; a first metallic film and second metallic film formed on both of the principle surfaces of the frame section of the framed crystal plate; and a base and cover stacked on both of the principle surfaces of the framed crystal plate. A crystal plate end surface electrode, which is electrically connected to the first metallic film, is electrically connected to a crystal plate auxiliary electrode; the crystal plate auxiliary electrode is electrically connected by a eutectic alloy while facing a base auxiliary electrode; the width of the frame section of one side on one end side of the framed crystal plate where the crystal plate auxiliary electrode is formed, differs from the width of the frame section of at least one other side; and a blocking film which blocks flow of the eutectic alloy to exciting electrodes, is provided on the conducting paths.

6 Claims, 14 Drawing Sheets

STACKED CRYSTAL RESONATOR

BACKGROUND OF THE INVENTION

1. Technical Field

The present invention relates to a surface mount crystal resonator, in particular, to a stacked crystal resonator in which a crystal plate is stacked between a base and a cover.

2. Background Art

A surface mount crystal resonator is provided built-in particularly in portable electronic devices as a source of frequency reference or time reference because of its small size and light weight. Responding to the needs of the information-oriented society in recent years, consumption of surface mount resonators is high and consequently there is a demand for an improvement in the productivity thereof. An example of this type of crystal resonator is a stacked crystal resonator in which a framed crystal plate composed of a resonating section and a frame section that surrounds the resonating section is stacked between a base and a cover.

PRIOR ART

FIG. 12 to FIG. 14 are drawings for describing a conventional example of a stacked crystal resonator, wherein FIG. 12A is a perspective view thereof, FIG. 12B is a side view thereof seen from direction A shown in FIG. 12A, FIG. 12C is a cross-sectional view taken along the line B-B shown in FIG. 12A, FIG. 13A is a plan view of one principle (main) surface of the crystal plate in a framed crystal plate, FIG. 13B is a plan view of the other principle surface of the framed crystal plate, FIG. 14A is a plan view of one principle surface of the base, and FIG. 14B is a plan view of the other principle surface of the base.

A stacked crystal resonator 1 is formed such that a ceramic-made base 3 and a metallic cover 4 are stacked on both of the principle surfaces of a framed crystal plate 2 (refer to FIG. 12). The framed crystal plate 2 includes a resonating section 6 having first and second exciting electrodes 5 (a, b) on both of the principle surfaces thereof, a frame section 7 that surrounds the resonating section 6, and first and second connecting sections 8 (a, b) that respectively extend from both sides at one end section of the resonating section 6 and that connect the resonating section 6 and the frame section 7 (refer to FIG. 13). Moreover, in the four corners of the frame section 7 there are formed cutaway sections 9 (a to d). The resonating section 6, the frame section 7, and the connecting sections 8 are integrally formed by etching a crystal wafer.

On one principle surface of the framed crystal plate 2 that joins with the cover 4, the first exciting electrode 5a is electrically connected to a first metallic film 11 formed on the entire periphery of the frame section 7 via a conducting path 10a provided on the surface of the first connecting section 8a (refer to FIG. 13A). The first metallic film 11 extends to the cutaway sections 9 (a, b), and is electrically connected to crystal plate end surface electrodes 12 respectively formed on the side surface portion of the cutaway sections 9 (a, b).

Meanwhile, on the other principle surface of the framed crystal plate 2 that joins with the base 3, the second exciting electrode 5b is electrically connected to a second metallic film 13 formed on the entire periphery of the frame section 7 via a conducting path 10b provided on the surface of the second connecting section 8b (refer to FIG. 13B). The second metallic film 13 is formed so as to be apart from the cutaway sections 9 (a to d).

Next, the base 3 is described (refer to FIG. 14). In the four corners of the base 3, there are formed cutaway sections 14 (a to d) respectively corresponding to the cutaway sections 9 (a to d) of the frame section 7. On the one principle surface of the base 3 that joins the framed crystal plate 2, there is formed a third metallic film 15 that faces and joins the second metallic film 13 via a eutectic alloy 19 (refer to FIG. 14A and FIG. 12C). The third metallic film 15 is provided on the outer periphery section of the base 3 and is electrically connected to second base end surface electrodes 16 respectively formed on the side surface portions of the cutaway sections 14 (c, d). The second base end surface electrodes 16 are electrically connected to mount terminals 17 (c, d) that are formed in the corners of the other principle surface of the base 3 where the cutaway sections 14 (c, d) are present (refer to FIG. 14B).

Moreover, first base end surface electrodes 18 are respectively formed on the side surface portions of the cutaway sections 14 (a, b), and are electrically connected to the crystal plate end surface electrodes 12 via the eutectic alloy 19. The first base end surface electrodes 18 are electrically connected to mount terminals 17 (a, b) that are formed in the corners of the other principle surface of the base 3 where the cutaway sections 14 (a, b) are present (refer to FIG. 14(A, B)).

Moreover, the surface of the cover 4 is plated using nickel with a Kovar base material, and joins the framed crystal plate 2 via the eutectic alloy 19a on the surface of the first metallic film 11 (refer to FIG. 12).

(Refer to Patent Document 1: Japanese Unexamined Patent Publication No. 2001-267875, and Patent Document 2: Japanese Examined Patent Publication No. S64-2288).

PROBLEMS IN PRIOR ART

However, in the stacked crystal resonator 1 of the conventional example having the above configuration, the base 3 and the cover 4 are joined to the crystal plate 2 by the eutectic alloy 19a. This type of joint is performed by heating and fusing the eutectic alloy 19a, and therefore the fused eutectic alloy 19a may flow through the conducting paths 10 into the exciting electrodes 5 (a, b) in some cases. As a result, there will be negative effects on the resonating characteristics of the crystal resonator 1 such as a reduction in crystal impedance, and the generation of spurious.

Moreover, the electrical connections between the crystal plate end surface electrodes 12 and the first base end surface electrodes 18 are performed by joining the cutaway sections 9 (a, b) with the cutaway sections 14 (a, b) corresponding thereto via the eutectic alloy 19b (refer to FIG. 12B). Therefore, this eutectic alloy 19b is provided on the side surface of the crystal resonator 1. However, the method of connecting the cutaway sections 9 (a, b) and the cutaway sections 14 (a, b) corresponding thereto using the eutectic alloy 19b is not reliable, and usually causes the manufacturing method of the crystal resonator 1 to become complex.

Furthermore, if the amount of the eutectic alloy 19b is small, then when force is applied, the eutectic alloy 19b may fail and consequently the connections between the crystal plate end surface electrodes 12 and the first base end surface electrodes 18 may be cut electrically. On the other hand, if the amount of the eutectic alloy 19b is large, the fused eutectic alloy 19b may flow to the second metallic film 13 and consequently an electrical short may occur.

PURPOSE OF THE INVENTION

An object of the present invention is to provide a crystal resonator capable of maintaining its resonating characteristics and ensuring electrical connections between end surface electrodes using a simple method.

POINT TO NOTE AND PROBLEM THEREOF

The aforementioned Patent Document 2 discloses a configuration where, on the surface of a crystal element, a chrome film and a gold film (or a silver film) are sequentially laminated, and conducting paths extending from exciting electrodes are formed, and some part of the gold film (or silver film) of the conducting paths is removed thereby exposing the chrome film on the surface of the crystal element. It also discloses that even if a soldering material is coated on the surface of the conducting paths, the exposed chrome film serves as an "anti-flowing part" for the soldering material, and prevents the soldering material from flowing to the exciting electrodes. The present invention focuses attention on this "anti-flowing part".

However, the chrome film is oxidized in order to sufficiently obtain the effect of the "anti-flowing part", or the chrome film unintentionally gets oxidized in some cases, and consequently the surface of the chrome film becomes chrome oxide. At this time, the area of the chrome becomes small on the cross-section of the region on the conducting paths where the chrome oxide is formed, and consequently the resistance value of the conducting paths becomes higher. Therefore, there will be a problem in that this causes negative effects on the resonating characteristics of the crystal resonator, and this problem becomes more significant as oxidization of the chrome progresses.

SUMMARY OF THE INVENTION

The crystal resonator of the present invention is a stacked crystal resonator provided with: a framed crystal plate in which a frame section surrounds a resonating section having first and second exciting electrodes on both principle surfaces thereof, and the resonating section and the frame section are connected by first and second connecting sections; first and second metallic films which are respectively formed on the entire periphery of both of one principle surface and the other principle surface of the frame section, and to which conducting paths extending from the first and second exciting electrodes are connected via the first and second connecting sections; and a base and cover which are stacked on both of the principle surfaces of the framed crystal plate, and the outer periphery section of which is joined with the frame section by a eutectic alloy so as to seal-enclose the resonating section; in which the first metallic film provided on the one principle surface of the framed crystal plate is electrically connected to one of a pair of mount terminals provided on one end side on the other principle surface, which is an opposite surface of one principle surface of the base, by a crystal plate end surface electrode formed in a cutaway section provided on the outer side surface of the framed crystal plate, and by a first base end surface electrode formed in a cutaway section provided on the outer side surface of the base; and the second metallic film provided on the other principle surface of the framed crystal plate is electrically connected to the other mount terminal provided on the other end side on the other principle surface of the base, by a third metallic film provided on the outer periphery of the one principle surface of the base, which joins with the framed crystal plate across its entire surface via the eutectic alloy, and by a second base end surface electrode which connects to the third metallic film and which is formed in a cutaway section provided on the outer side surface of the base, wherein; the crystal plate end surface electrode which is electrically connected to the first metallic film on the one principle surface of the framed crystal plate, is electrically connected to a crystal plate auxiliary electrode which is provided on the outer periphery of the cutaway section on the surface of the other principle surface of the framed crystal plate so as to be apart from the second metallic film, and the crystal plate auxiliary electrode faces and electrically connects via the eutectic alloy to a base auxiliary electrode provided on the one principle surface of the base; the width of the frame section of the framed crystal plate on one side on the one end side where the crystal plate auxiliary electrode is formed, differs from the width of the frame section at least on one other side; and on the conducting paths there is provided a blocking film which blocks flow of the eutectic alloy to the exciting electrodes.

EFFECT OF THE INVENTION

According to such a configuration, the blocking film is provided on the conducting paths, and therefore the fused eutectic alloy will not flow to the first and second exciting electrodes. Consequently, a reduction in crystal impedance, and the generation of spurious will not occur, and the resonating characteristics of the crystal resonator are thus maintained.

Moreover, the electrical connection between the crystal plate end surface electrode and the first base end surface electrode is made by joining the crystal plate auxiliary electrode and the base auxiliary electrode respectively connected thereto, using the eutectic alloy. Therefore, the crystal plate end surface electrode and the first base end surface electrode can easily be connected electrically. Moreover, there is no risk of failure in this eutectic alloy, and it is therefore possible to avoid electrical connection cut between the crystal plate end surface electrode and the first base end surface electrode.

Furthermore, the width of the frame section of the framed crystal plate on one side on the one end side where the crystal plate auxiliary electrode is formed, differs from the width of the frame section at least on one other side. Therefore, a sufficient clearance can be made between the crystal plate auxiliary electrode and the second metallic film, and it is accordingly possible to prevent an electrical short by the eutectic alloy between the crystal plate auxiliary electrode and the second metallic film.

In the present invention, there is provided a configuration where the width of the frame section of the framed crystal plate on one side on the one end side where the crystal plate auxiliary electrode is formed, is greater than the width of the frame section of another side on the other end side.

Moreover, in the present invention, the one and other mount terminals are of a two-terminal configuration in which one of each terminal is arranged on both end sides and in the widthwise center of the base.

Furthermore, in the present invention, the one and other mount terminals are of a four-terminal configuration in which two of these terminals are respectively arranged on both sides of one same side.

In the present invention, the one and other mount terminals are four terminals, two of which terminals are respectively provided on both sides of the same one side, and are of a configuration in which the width of the frame section of one side on one end side of the framed crystal plate where the crystal plate auxiliary electrode is formed, is smaller than the width of the frame section of another side orthogonal to the one side mentioned above.

In the present invention, there is provided a configuration such that the blocking film is a metal oxide film formed on the conducting paths.

Thus, the configuration of the stacked crystal resonator is defined.

BRIEF DESCRIPTION OF THE DRAWINGS

FIG. 1 includes drawings of a framed crystal plate for describing a first embodiment of a stacked crystal resonator of the present invention, wherein

FIG. 2 includes drawings of a base for describing the first embodiment of a stacked crystal resonator of the present invention, wherein

FIG. 4 includes cross-sectional views of the connecting section in the framed crystal plate for describing a modified example of the first embodiment of the present invention, wherein

FIG. 5 includes drawings of a framed crystal plate in a stacked crystal resonator for describing another modified example of the first embodiment of the present invention, wherein

FIG. 6 includes drawings of a framed crystal plate for describing a second embodiment of a stacked crystal resonator of the present invention, wherein

FIG. 7 includes drawings of a base for describing the second embodiment of a stacked crystal resonator of the present invention, wherein

FIG. 9 includes drawings of a framed crystal plate for describing another modified example of the second embodiment of a stacked crystal resonator of the present invention, wherein

FIG. 10 includes drawings of a framed crystal plate for describing a third embodiment of a stacked crystal resonator of the present invention, wherein

FIG. 11 includes drawings of a base for describing the third embodiment of a stacked crystal resonator of the present invention, wherein

FIG. 12 includes drawings for describing one conventional example of a stacked crystal resonator, wherein

FIG. 13 includes plan views of a framed crystal plate for describing the one conventional example of a stacked crystal resonator, wherein

FIG. 14 includes plan views of a base for describing the one conventional example of a stacked crystal resonator, wherein

DETAILED DESCRIPTION OF THE PREFERRED EMBODIMENTS

First Embodiment

Figure 1A:
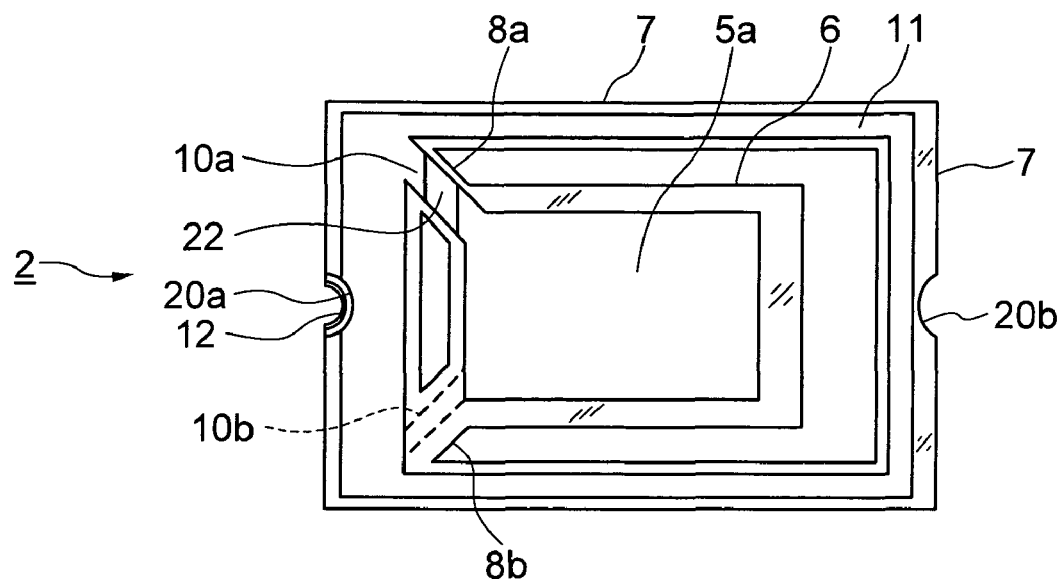
FIG. 1A is a plan view of one principle surface of the crystal plate.
Figure 1B:
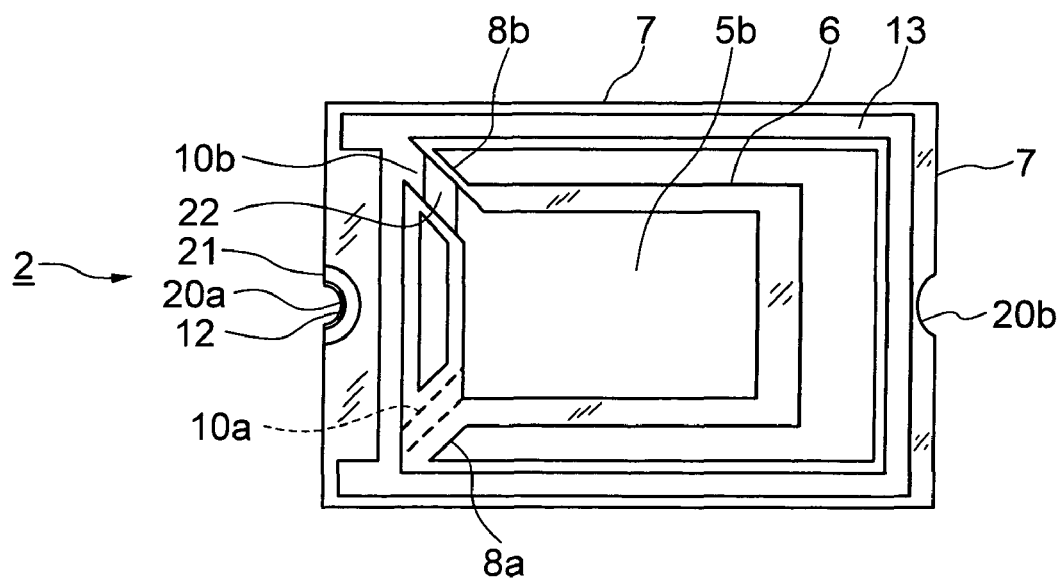
FIG. 1B is a plan view of the other principle surface of the crystal plate.
Figure 2A:
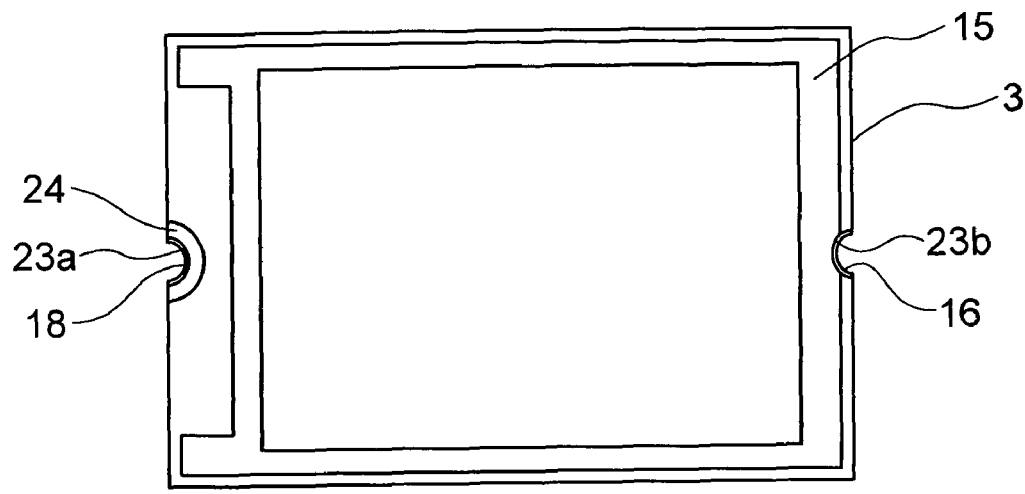
FIG. 2A is a plan view of one principle surface of the base.
Figure 2B:
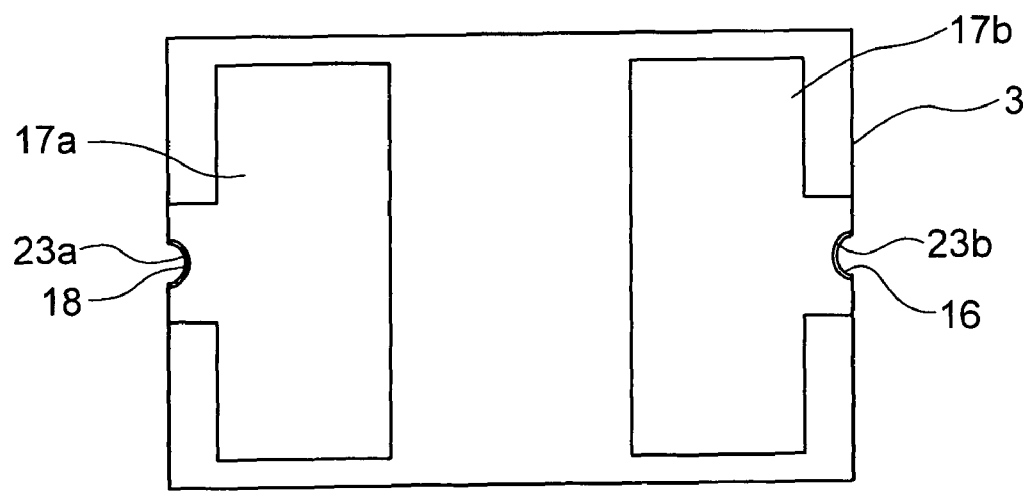
FIG. 2B is a plan view of the other principle surface of the base.

FIG. 1 and FIG. 2 are drawings for describing a first embodiment of a stacked crystal resonator of the present invention. FIG. 1A is a plan view of one principle surface of a framed crystal plate, FIG. 1B is a plan view of the other principle surface of the framed crystal plate, FIG. 2A is a plan view of one principle surface of a base, and FIG. 2B is a plan view of the other principle surface of the base. The same reference symbols are given to portions the same as those in the aforementioned conventional example, and descriptions thereof are simplified or omitted.

A stacked crystal resonator 1 is formed such that a ceramic-made base 3 and a metallic cover 4 are stacked on both of the principle surfaces of a framed crystal plate 2. The framed crystal plate 2 includes a resonating section 6 having first and second exciting electrodes 5 (a, b) on both of the principle surfaces thereof, a frame section 7 that surrounds the resonating section 6, and first and second connecting sections 8 (a, b) that respectively extend from both sides at one end section of the resonating section 6 and that connect the resonating section 6 and the frame section 7. On the frame section 7 there are formed, in the widthwise center sections on both of the lengthwise end sides thereof, cutaway sections 20 (a, b).

On one principle surface of the frame crystal plate 2 that joins with the cover 4, the first exciting electrode 5a is electrically connected to a first metallic film 11 formed on the entire periphery of the frame section 7 via a conducting path 10a provided on the surface of the first connecting section 8a (refer to FIG. 1A). The first metallic film 11 extends to the cutaway section 20a, and is electrically connected to a crystal plate end surface electrode 12 formed on the side surface portion of the cutaway section 20a. The crystal plate end surface electrode 12 is electrically connected to a crystal plate auxiliary electrode 21 that is formed on the lower surface outer periphery of the cutaway section 20a on the other principle surface of the framed crystal plate 2. The first metallic film 11 is formed so as to be apart from the outer periphery section of the cutaway section 20b.

Meanwhile, on the other principle surface of the framed crystal plate 2 that joins with the base 3, the second exciting electrode 5b is electrically connected to a second metallic film 13 formed on the entire periphery of the frame section 7 via a conducting path 10b provided on the surface of the second connecting section 8b (refer to FIG. 1B). The second metallic film 13 is formed so as to be apart from the crystal plate auxiliary electrode 21 and the cutaway section 20b. Moreover, a blocking film 22 composed of a chrome oxide is formed on the surface of the conducting paths 10 (a, b) so as to block the flow of a eutectic alloy 19 to the first exciting electrode 5a and the second exciting electrode 5b as described later.

Moreover, the film width of the second metallic film 13 is, for example, 50 μm. Since the crystal plate auxiliary electrode 21 and the second metallic film 13 need to be formed apart from each other, the width of the frame section 7 on the side where the cutaway section 20a is formed is made, for example, 200 μm, which is greater than the width of the frame section 7 on the other side. The width of the frame section 7 where the cutaway section 20b is formed is, for example, 150 μm. In order to miniaturize the planar outer dimension of the crystal resonator 1, the width of the frame section 7 on the sides where the cutaway sections 20 (a, b) are not formed is made, for example, 100 μm, which is close to the width of the second metallic film 13. That is to say, the width of the frame section 7 on one side on the one end side of the framed crystal plate 2 where the crystal plate auxiliary electrode 21 is formed (the one side where the cutaway section 20a is formed) is made greater than the width of the frame section 7 on the other side.

Next, the base 3 is described (refer to FIG. 2). In the widthwise center section on both of the lengthwise end sides of the base 3, there are respectively formed cutaway sections 23 (a, b) corresponding to the cutaway sections 20 (a, b) of the framed crystal plate 2.

On one principle surface of the base 3 that joins with the framed crystal plate 2, there is formed a base auxiliary electrode 24 that joins with the crystal plate auxiliary electrode 21 via the eutectic alloy 19 so as to face the crystal plate auxiliary electrode 21. The base auxiliary electrode 24 is formed on the outer periphery of the cutaway section 23a (refer to FIG. 2A), and is electrically connected to a first base end surface electrode 18 formed in the cutaway section 23a. The first base end surface electrode 18 is electrically connected to a mount terminal 17a formed on one end of the other principle surface of the base 3 where the cutaway section 23a is present.

Moreover, on the outer periphery section of the one principle surface of the base 3, there is formed a third metallic film 15 that faces the second metallic film 13. The third metallic film 15 is electrically connected to a second base end surface electrode 16 formed in the cutaway section 23b. The second base end surface electrode 16 is electrically connected to a mount terminal 17b formed on one end of the other principle surface of the base 3 where the cutaway section 23b is present. Moreover, the third metallic film 15 is formed so as to be apart from the base auxiliary electrode 24.

In this type of configuration, first, etching is conducted on a crystal wafer so as to integrally form the framed crystal plate 2 having the resonating section 6, the frame section 7, and the connecting sections 8. Next, the first and second exciting electrodes 5 (a, b), the conducting paths 10 (a, b), the crystal plate end surface electrode 12, and the first and second metallic films 11 and 13 are formed as laminated films having a chrome film 25a as a lower layer and a gold film 26 as an upper layer (refer to FIG. 3) by means of vapor deposition or sputtering.

Next, a chrome film 25b is formed on part of the surface of the conducting paths 10 (a, b) by means of vapor deposition or sputtering. Then the chrome film 25b on the surface of the gold film 26 is made oxidized by leaving it in the atmosphere, thereby forming the blocking film 22 composed of chrome oxide on the connecting sections 8 (refer to FIG. 3).

Moreover, the base 3 is formed as described below. First, through holes, which become the cutaway sections 23, are provided in a ceramic green sheet. Next, a tungsten film, which becomes the layer under; the mount terminals 17, the base auxiliary electrode 24, the third metallic film 15, the first base end surface electrode 18, and the second base end surface electrode 16 (hereunder, referred to as "mount terminals 17 and so forth"), is formed by means of printing.

Next, the ceramic green sheet is sintered, and a nickel film and a gold film are sequentially provided on the surface of the tungsten film by means of electrolytic plating or electroless plating, thereby forming the mount terminals 17 and so forth. Then, the ceramic green sheet is divided thereby forming the base 3.

Finally, the framed crystal plate 2 is stacked between the base 3 and the cover 4. In this process, first, the eutectic alloy 19 is loaded between the cover 4 and the first metallic film 11, between the second metallic film 13 and the third metallic film 15, and between the crystal plate auxiliary electrode 21 and the base auxiliary electrode 24. Then the eutectic alloy 19 is heated and fused. Thereby, the framed crystal plate 2, and the base 3 and the cover 4 are stacked and joined together.

With this type of configuration, the blocking film 22 composed of chrome oxide is provided on the conducting paths 10 (a, b), and therefore, the fused eutectic alloy 19 will not flow to the first and second exciting electrodes 5 (a, b). Therefore, a reduction in crystal impedance, and the generation of spurious will not occur, and the resonating characteristics of the crystal resonator are thus maintained. In FIG. 1, the blocking film 22 is formed across the entire width of the conducting paths 10 (a, b). However, the purpose of the blocking film 22 is to block the flow of the eutectic alloy 19 to the exciting electrodes 5 (a, b), and therefore, this does not have to be formed across the entire width of the connecting sections 8a and 8b as long as this purpose is fulfilled.

Figure 3:
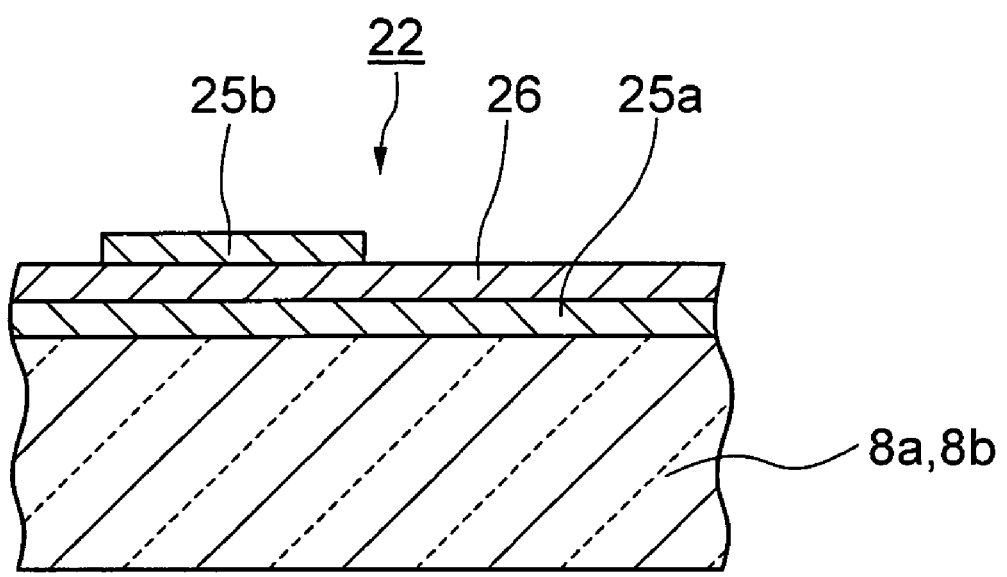
FIG. 3 is a cross-sectional view of a connecting section in the framed crystal plate for describing the first embodiment of the present invention.

Moreover, as shown in FIG. 3, under the layer of the blocking film 22 composed of chrome oxide, which is formed on the conducting paths 10 (a, b), there are formed the chrome film 25a and the gold film 26. Therefore, even if the chrome on the surface of the gold film 26 gets oxidized, a predetermined resistance value of the conducting paths 10 (a, b) can be ensured, and accordingly there will be no negative effects on the resonating characteristic of the crystal resonator 1.

Moreover, the electrical connection between the crystal plate end surface electrode 12 and the first base end surface electrode 18 is made by joining the crystal plate auxiliary electrode 21 and the base auxiliary electrode 24 respectively connected thereto, using the eutectic alloy 19. Therefore, the crystal plate end surface electrode 12 and the first base end surface electrode 18 can easily be connected electrically. Moreover, there is no risk of failure in this eutectic alloy 19, and it is therefore possible to avoid electrical connection cut between the crystal plate end surface electrode 12 and the first base end surface electrode 18.

Furthermore, the film width of the first metallic film 11 and the second metallic film 13 is made 50 μm, for example, and it is therefore possible to ensure the strength in the joint of the eutectic alloy 19 between the framed crystal plate 2, and the cover 4 and the base 3. Also, by making the width of the frame section 7 on the one side where the cutaway section 20a is formed greater than the width of the other side, a sufficient clearance can be ensured between the crystal plate auxiliary electrode 21 and the second metallic film 13 while ensuring the above film width, and it is therefore possible to prevent an electrical short between the crystal plate auxiliary electrode 21 and the second metallic film 13.

Modified Example of First Embodiment

Figure 4A:
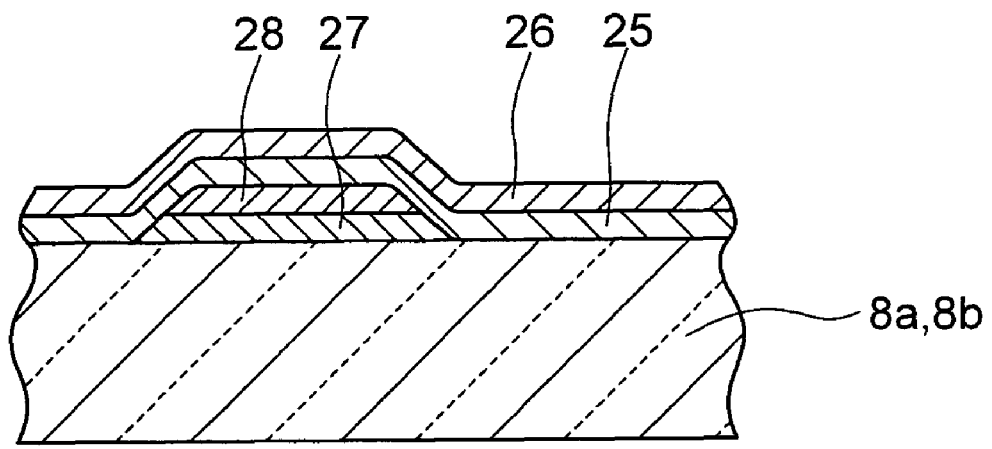
FIG. 4A is a cross-sectional view showing a state before etching.
Figure 4B:
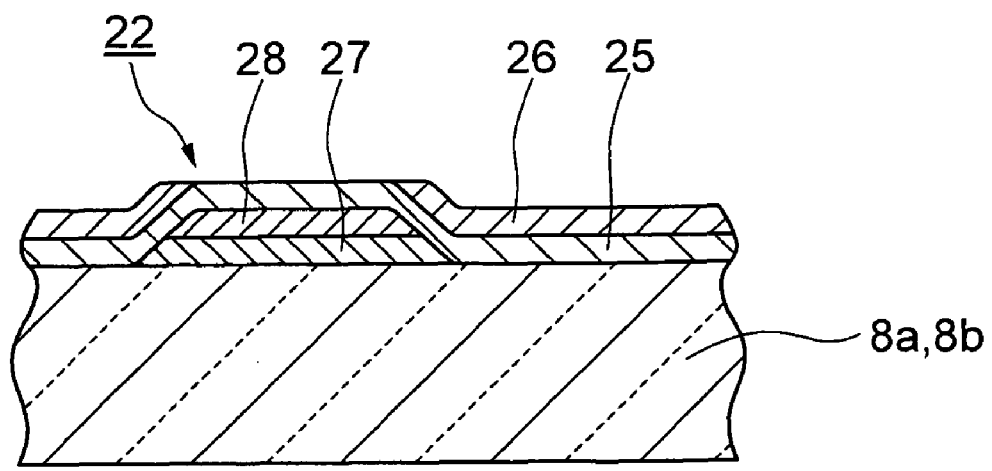
FIG. 4B is a cross-sectional view showing a state after etching.

FIG. 4 includes cross-sectional views of the supporting frame sections (connecting sections) 8 in the framed crystal plate for describing a modified example of the first embodiment of the present invention, wherein FIG. 4A is a cross-sectional view showing a state before etching, and FIG. 4B is a cross-sectional view showing a state after etching. The same reference symbols are given to portions the same as those in the above embodiment, and descriptions thereof are simplified or omitted.

The present modified example differs from the first embodiment in the method of fabricating a blocking film 22 composed of chrome oxide. First, as shown in FIG. 4A, before forming conducting paths 10 (a, b) as shown in FIG. 1A and FIG. 1B, in a region where the blocking film 22 is to be formed, there are formed, by means of vapor deposition or sputtering, laminated films having a nickel film 27 as a lower layer and a tungsten film 28 as an upper layer.

Next, in a region, which becomes the conducting paths 10, including the region where the blocking film 22 is to be formed, there are formed, by means of vapor deposition or sputtering, laminated films with a chrome film 25 serving as a lower layer and a gold film 26 serving as an upper layer. Thus, the region where the blocking film 22 is formed has a configuration where the first layer is the nickel film 27, the second layer is the tungsten film 28, the third layer is the chrome film 25, and the fourth layer is the gold film 26. When further forming the third layer and the fourth layer, the first and second exciting electrodes 5 (a, b), the crystal plate end surface electrode 12, the first metallic film 11 and the second metallic film 13 as shown in FIG. 1A and FIG. 1B with a chrome film serving as a lower layer and a gold film serving as an upper layer, are also formed simultaneously.

Next, as shown in FIG. 4B, the gold film 26, which becomes the fourth layer of the region where the blocking film 22 is formed, is removed by means of etching, and the chrome film is exposed as a result. Finally, the chrome film 25 is made oxidized by leaving the framed crystal plate 2 in the atmosphere, and the chrome oxide, which is the blocking film 22, is thereby formed.

Thereby, the blocking film 22 is provided on the conducting paths 10 (a, b), and therefore, the fused eutectic alloy 19 will not flow to the first and second exciting electrodes 5 (a, b). Moreover, since the chrome film 25 and the gold film 26 are present under the layer of the blocking film 22 composed of chrome oxide, a predetermined resistance value of the conducting paths 10 (a, b) can be ensured, and there will be no negative effects on the resonating characteristic of the crystal resonator 1.

Moreover, in the present modified example, the nickel film 27 and the tungsten film 28 are formed under the layer of the chrome film 25. However, the gold film provided under the layer of the chrome film 25 is not limited to the nickel film 27 and the tungsten film 28. As long as a predetermined resistance value of the conducting paths 10 can be ensured, any type of a metallic film may be used.

Another Modified Example of First Embodiment

Figure 5A:
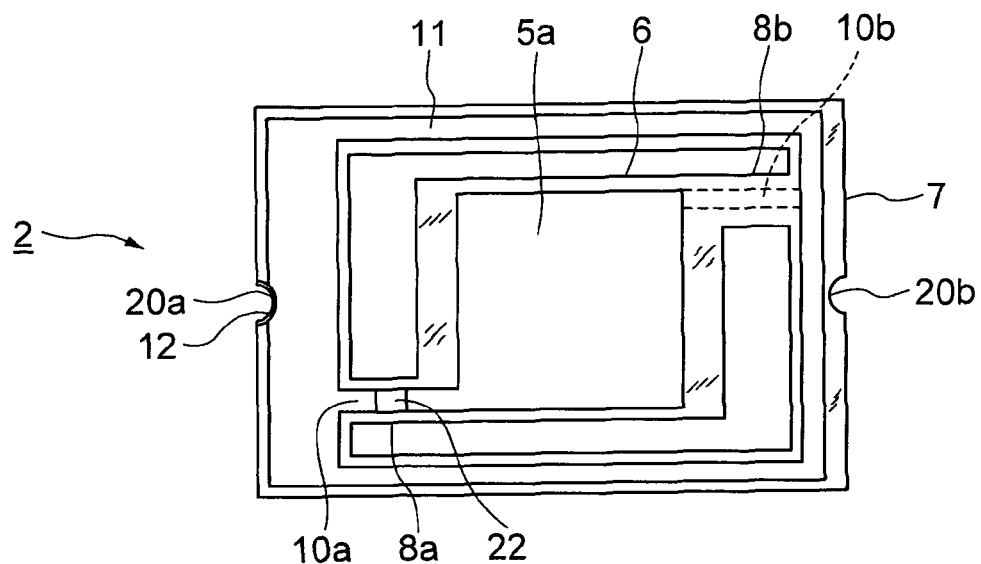
FIG. 5A is a plan view of one principle surface of the crystal plate.
Figure 5B:
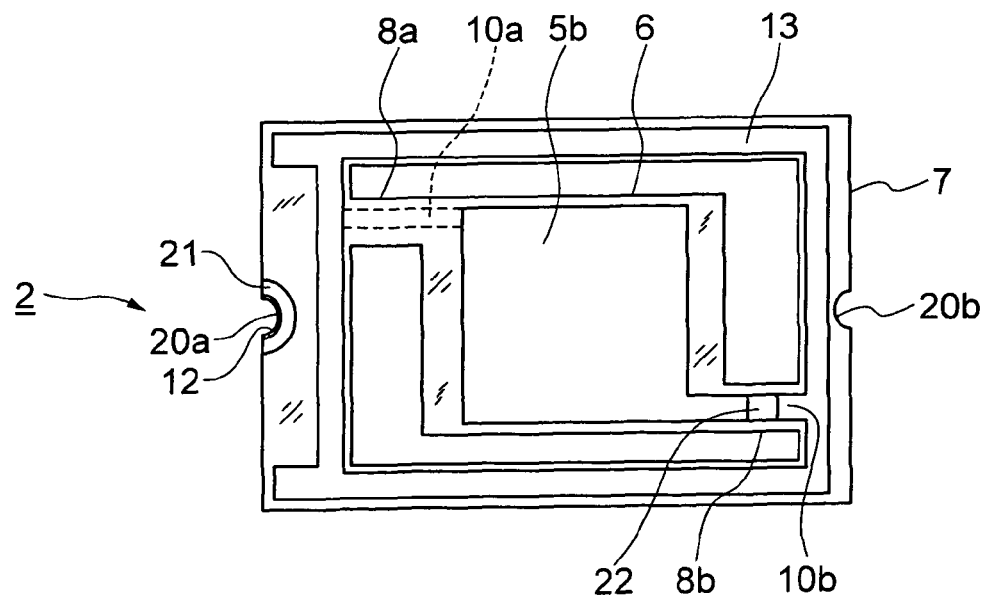
FIG. 5B is a plan view of the other principle surface of the crystal plate.

FIG. 5 includes drawings of a framed crystal plate in a stacked crystal resonator for describing another modified example of the first embodiment of the present invention, wherein FIG. 5A is a plan view of one principle surface of the crystal plate, and FIG. 5B is a plan view of the other principle surface thereof. The present modified example differs from the first embodiment in that the connecting sections 8 (a, b) are formed in opposing corners of the frame section 7 of the framed crystal plate 2. Other aspects thereof are the same as those of the first embodiment.

Second Embodiment

Figure 6A:
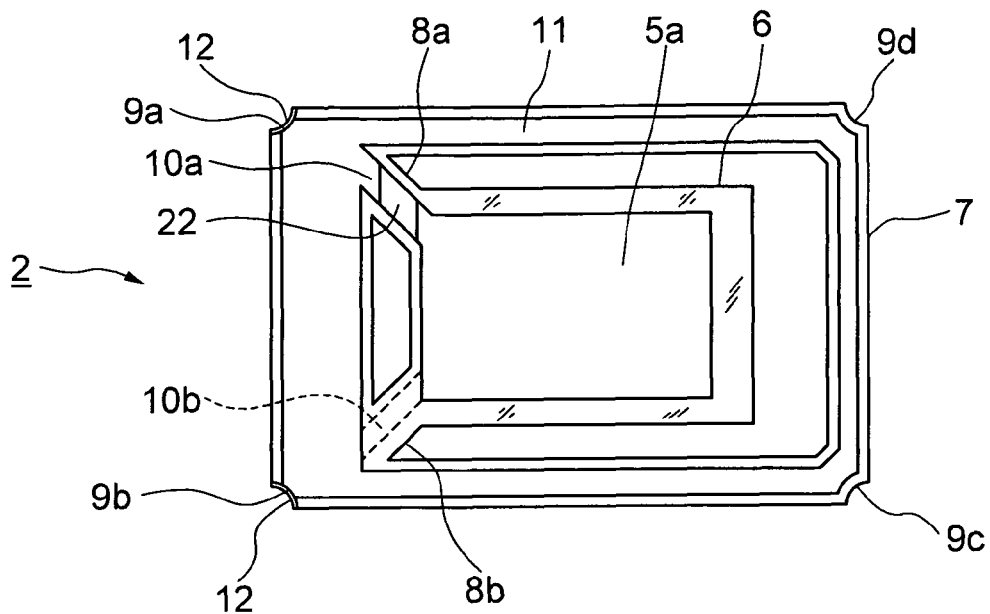
FIG. 6A is a plan view of one principle surface of the crystal plate.
Figure 6B:
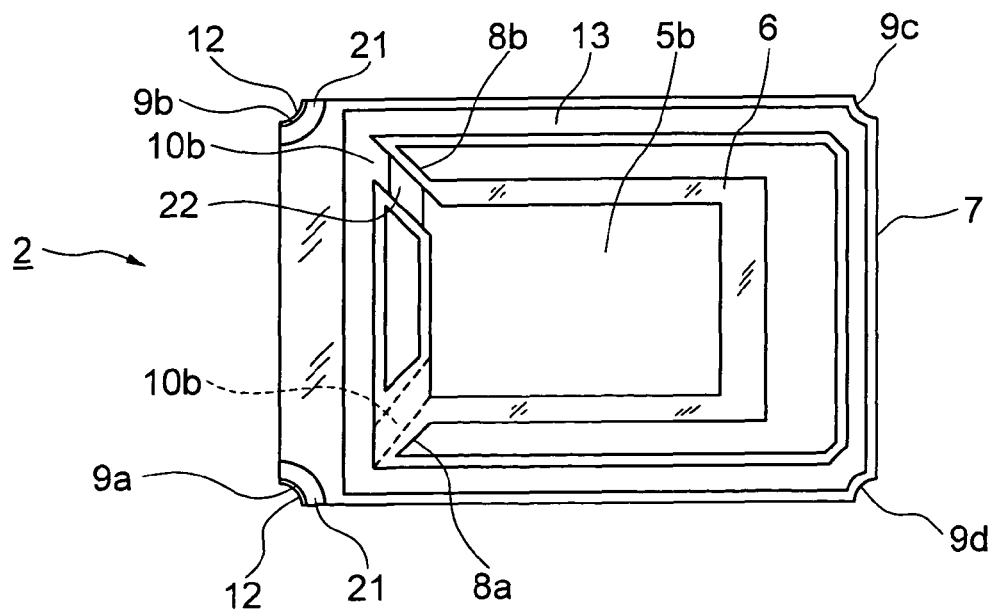
FIG. 6B is a plan view of the other principle surface of the crystal plate.
Figure 7A:
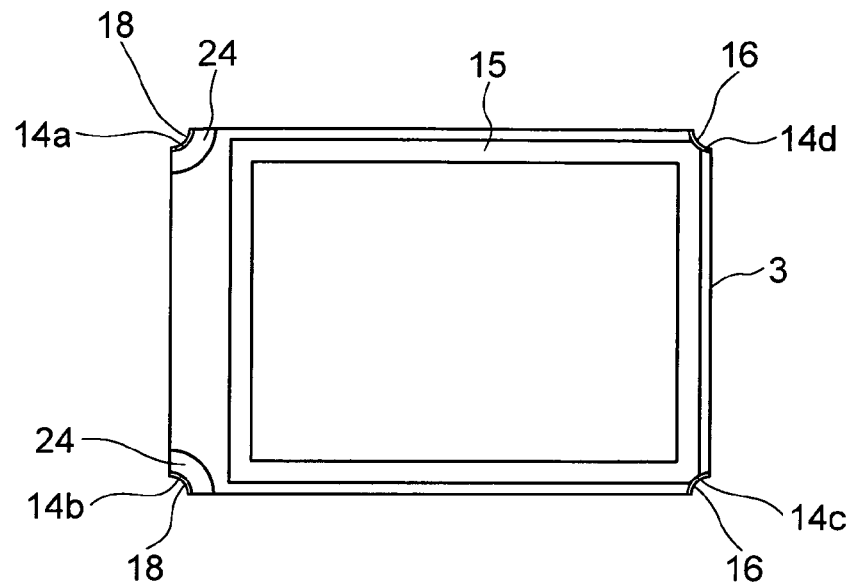
FIG. 7A is a plan view of one principle surface of the base.
Figure 7B:
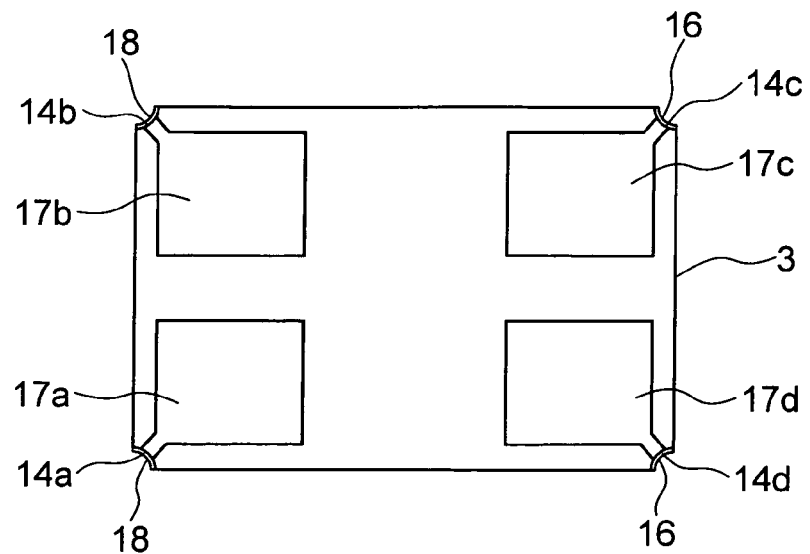
FIG. 7B is a plan view of the other principle surface of the base.

FIG. 6 and FIG. 7 are drawings for describing a second embodiment of a stacked crystal resonator of the present invention. FIG. 6A is a plan view of one principle surface of a framed crystal plate, FIG. 6B is a plan view of the other principle surface of the framed crystal plate, FIG. 7A is a plan view of one principle surface of a base, and FIG. 7B is a plan view of the other principle surface of the base. The same reference symbols are given to portions the same as those in the above embodiment, and descriptions thereof are simplified or omitted.

A stacked crystal resonator 1 is formed such that a ceramic-made base 3 and a metallic cover 4 are stacked on both of the principle surfaces of a framed crystal plate 2. As shown in FIG. 6A and FIG. 6B, the framed crystal plate 2 includes a resonating section 6 having first and second exciting electrodes 5 (a, b) on both of the principle surfaces thereof, a frame section 7 that surrounds the resonating section 6, and first and second connecting sections 8 (a, b) that respectively extend from both sides at one end section of the resonating section 6 and that connect the resonating section 6 and the frame section 7. In four corners of the frame section 7 there are formed cutaway sections 9 (a to d).

On one principle surface of the frame crystal plate 2 that joins with the cover 4, as shown in FIG. 6A, the first exciting electrode 5a is electrically connected to a first metallic film 11 formed on the entire periphery of the frame section 7 via a conducting path 10a provided on the surface of the first connecting section 8a. The first metallic film 11 extends to the cutaway sections 9 (a, b), and is electrically connected to crystal plate end surface electrodes 12 respectively formed on the side surface portion of the cutaway sections 9 (a, b). The crystal plate end surface electrodes 12 are electrically connected to crystal plate auxiliary electrodes 21 that are formed on the outer periphery of the cutaway section 9a on the other principle surface of the framed crystal plate 2. The first metallic film 11 is formed so as to be apart from the outer periphery section of the cutaway sections 9 (c, d).

Meanwhile, as shown in FIG. 6B, on the other principle surface of the framed crystal plate 2 that joins with the base 3, the second exciting electrode 5b is electrically connected to a second metallic film 13 formed on the entire periphery of the frame section 7 via a conducting path 10b provided on the surface of the second connecting section 8b. The second metallic film 13 is formed so as to be apart from the crystal plate auxiliary electrodes 21 and the cutaway sections 9 (c, d). Moreover, a blocking film 22 composed of chrome oxide is formed on the surface of the conducting paths 10 (a, b).

Here, the film width of the second metallic film 13 is, for example, 50 μm. The width of the frame section 7 on one side having the cutaway section 9a and the cutaway section 9b on both ends thereof is made, for example, 200 μm, because the crystal plate auxiliary electrodes 21 and the second metallic film 13 need to be formed apart from each other. Moreover, in order to miniaturize the planar outer dimension of the crystal resonator 1, the width of the frame section 7 on the other side is made, for example, 100 μm, which is close to the width of the second metallic film 13. That is to say, the width of the one side of the frame section 7 on one end side of the framed crystal plate 2 where the crystal plate auxiliary electrodes 21 are formed (one side having the cutaway section 9a and the cutaway section 9b on both ends thereof) is made greater than the width of the other side of the frame section.

Next, the base 3 is described (refer to FIG. 7). In the four corner sections of the base 3, there are formed cutaway sections 14 (a to d) respectively corresponding to the cutaway sections 9 (a to d) of the framed crystal plate 2.

As shown in FIG. 7A, on one principle surface of the base 3 that joins with the framed crystal plate 2, there are formed base auxiliary electrodes 24 that join with the crystal plate auxiliary electrodes 21 via the eutectic alloy 19 so as to face the crystal plate auxiliary electrodes 21. The base auxiliary electrodes 24 are formed on the outer periphery of the cutaway sections 14 (a, b), and are electrically connected to first base end surface electrodes 18 formed in the side surface portions of the cutaway sections 14 (a, b). The first base end surface electrodes 18 are electrically connected to mount terminals 17 (a, b) that are formed in the corners of the other principle surface of the base 3 where the cutaway sections 14 (a, b) are present.

Moreover, on the outer periphery section of the one principle surface of the base 3, there is formed a third metallic film 15 that faces the second metallic film 13. The third metallic film 15 is electrically connected to second base end surface electrodes 16 formed in the cutaway sections 14 (c, d). The second base end surface electrodes 16 are electrically connected to mount terminals 17 (c, d) that are formed in the corners of the other principle surface of the base 3 where the cutaway sections 14 (c, d) are present. Moreover, the third metallic film 15 is formed so as to be apart from the base auxiliary electrodes 24.

According to this type of configuration, effects similar to those in the above first embodiment can be achieved. That is to say, the blocking film 22 is provided on the conducting paths 10 (a, b), and therefore, the fused eutectic alloy 19 will not flow to the first and second exciting electrodes 5 (a, b). Moreover, a chrome film and a gold film are formed under the layer of the blocking film 22 composed of chrome oxide formed on the conducting paths 10 (a, b), and therefore there will be no negative effects on the resonating characteristic of the crystal resonator 1. Moreover, it is possible to avoid electrical connection cut between the crystal plate end surface electrodes 12 and the first base end surface electrodes 18. Furthermore, it is possible to prevent an electrical short by the eutectic alloy 19 between the crystal plate auxiliary electrodes 21 and the second metallic film 13.

Modified Example of Second Embodiment

Figure 8:
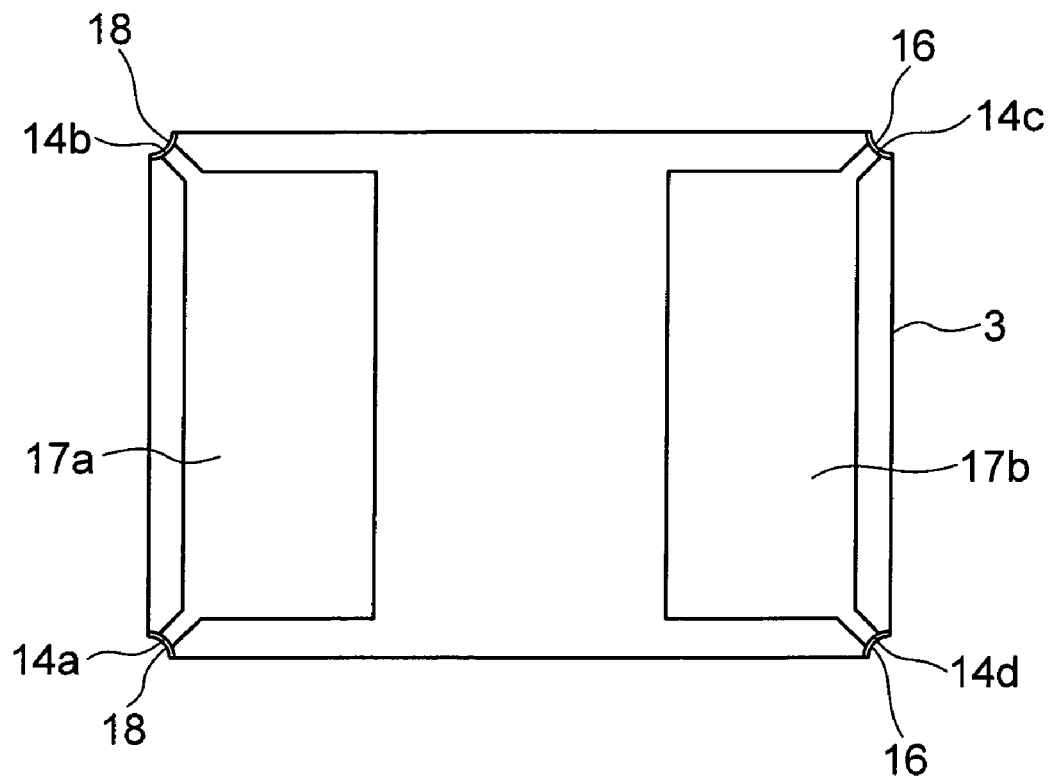
FIG. 8 is a plan view of a base for describing a modified example of the second embodiment of a stacked crystal resonator of the present invention.

FIG. 8 is a plan view of a base of a stacked crystal resonator for describing a modified example of the second embodiment of the present invention. The present modified example differs from the second embodiment in that it is configured with two mount terminals 17a and 17b. That is to say, in the present modified example, first base end surface electrodes 18 are connected to the mount terminal 17a on one end side of the other principle surface of the base 3 where cutaway sections 14 (a, b) are formed, and second base end surface electrodes 16 are connected to the mount terminal 17b on the other end side.

Another Modified Example of Second Embodiment

Figure 9A:
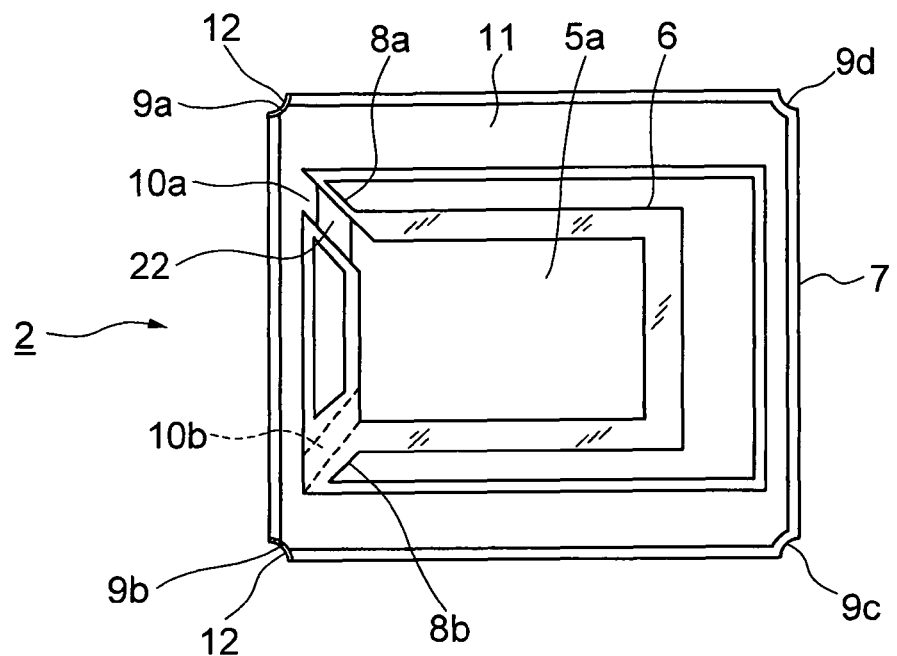
FIG. 9A is a plan view of one principle surface of the crystal plate.
Figure 9B:
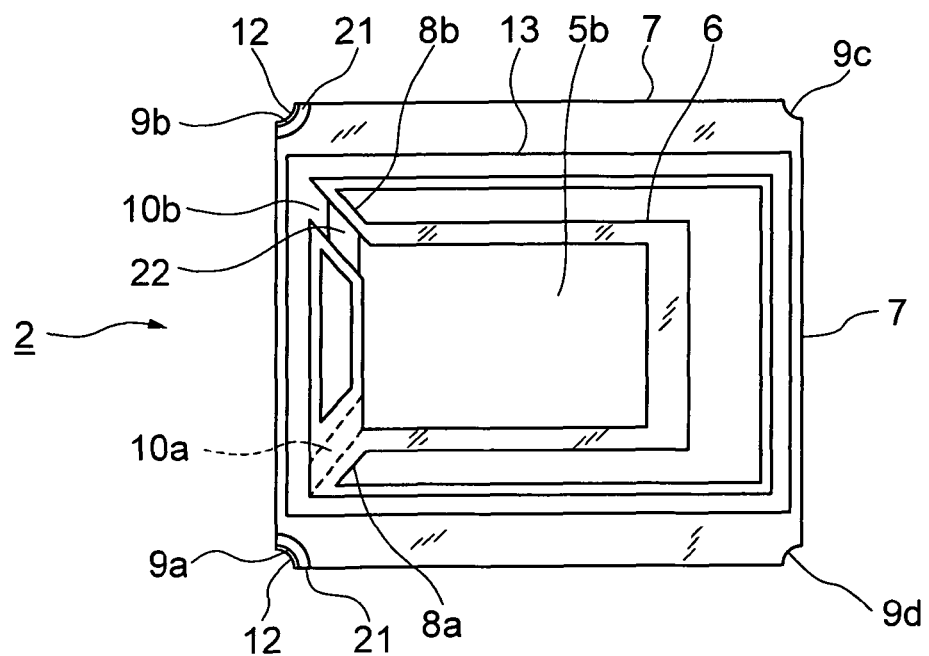
FIG. 9B is a plan view of the other principle surface of the crystal plate.

FIG. 9 includes plan views of a framed crystal plate in a stacked crystal resonator for describing another modified example of the second embodiment of the present invention, wherein FIG. 9A is a plan view of one principle surface of the crystal plate, and FIG. 9B is a plan view of the other principle surface thereof. The same reference symbols are given to portions the same as those in the above embodiments, and descriptions thereof are simplified or omitted.

The present modified example differs from the second embodiment in the width of the frame section 7 of the framed crystal plate 2, and it is specifically described below. The film width of the second metallic film 13 is made, for example, 50 µm. The width of the frame section on one side having a cutaway section 9a and a cutaway section 9b on both ends thereof, and the width on the side opposite of this one side, are made, for example, 100 µm, which is close to the width of the second metallic film 13, in order to miniaturize the planar outer dimension of the crystal resonator 1. Moreover, the width of the frame section 7 of the two sides orthogonal to the above two sides is made, for example, 200 µm in order to form the crystal plate auxiliary electrodes 21 and the second metallic film 13 apart from each other. That is to say, the width of the frame section 7 on the one side on one end side of the framed crystal plate 2 where the crystal plate auxiliary electrodes 21 are formed (the one side having the cutaway section 9a and the cutaway section 9b on both ends thereof) is made less than the width of the frame section on the two sides orthogonal to the above one side.

Third Embodiment

Figure 10A:
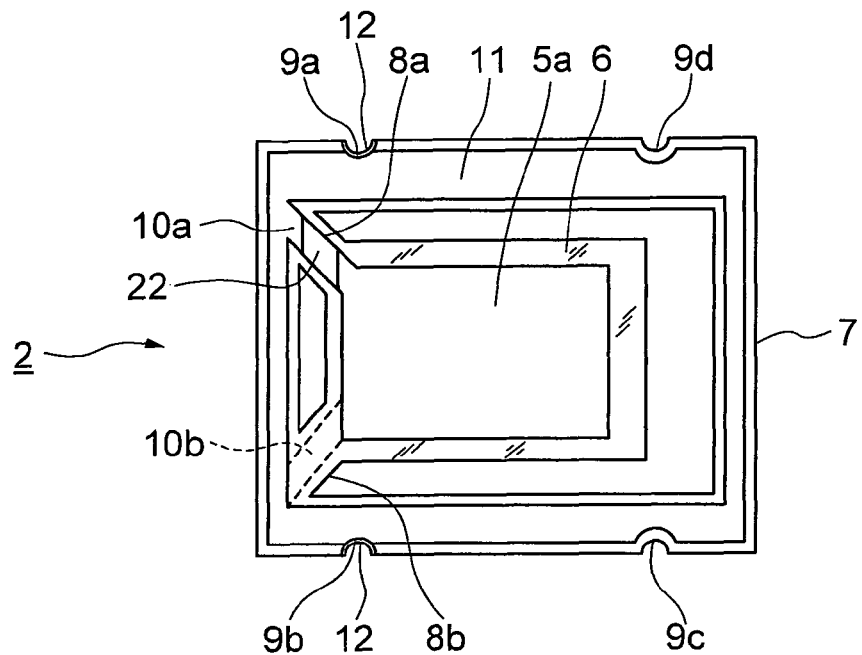
FIG. 10A is a plan view of one principle surface of the crystal plate.
Figure 10B:
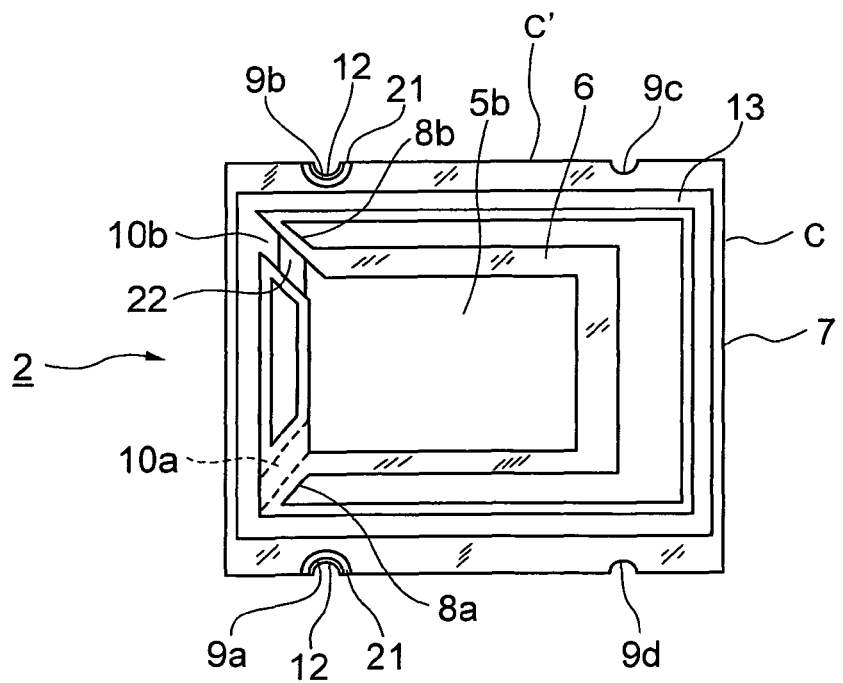
FIG. 10B is a plan view of the other principle surface of the crystal plate.
Figure 11A:
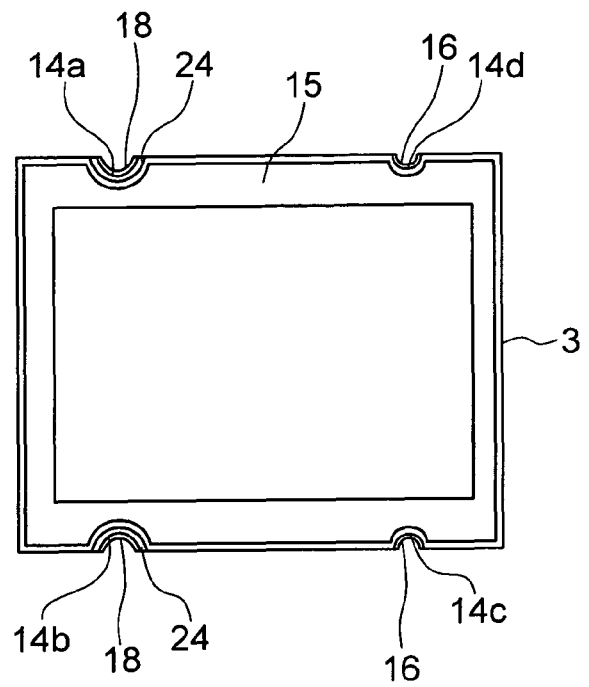
FIG. 11A is a plan view of one principle surface of the base.
Figure 11B:
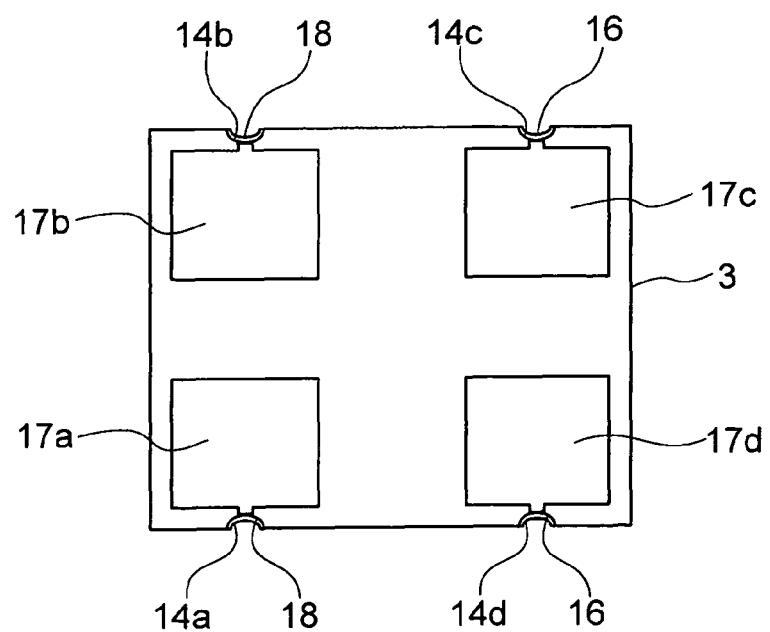
FIG. 11B is a plan view of the other principle surface of the base.

FIG. 10 and FIG. 11 are drawings of a stacked crystal resonator for describing a third embodiment of the present invention. FIG. 10A is a plan view of one principle surface of a framed crystal plate, FIG. 10B is a plan view of the other principle surface of the framed crystal plate, FIG. 11A is a plan view of one principle surface of a base, and FIG. 11B is a plan view of the other principle surface of the base. The same reference symbols are given to portions the same as those in the above embodiments, and descriptions thereof are simplified or omitted.

Figure 12A:
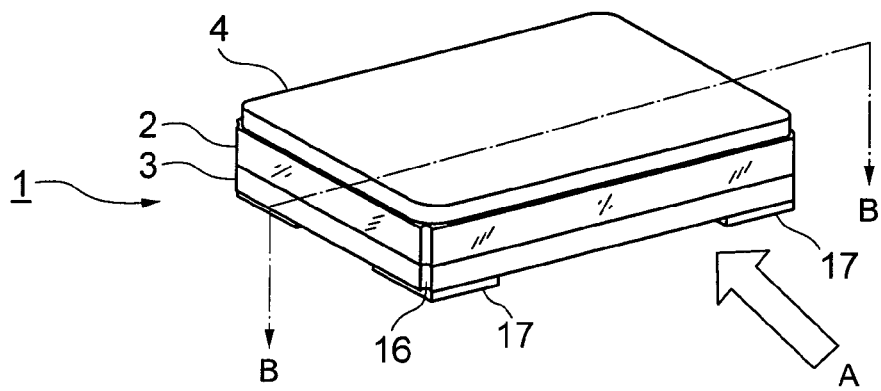
FIG. 12A is a perspective view thereof.
Figure 12B:
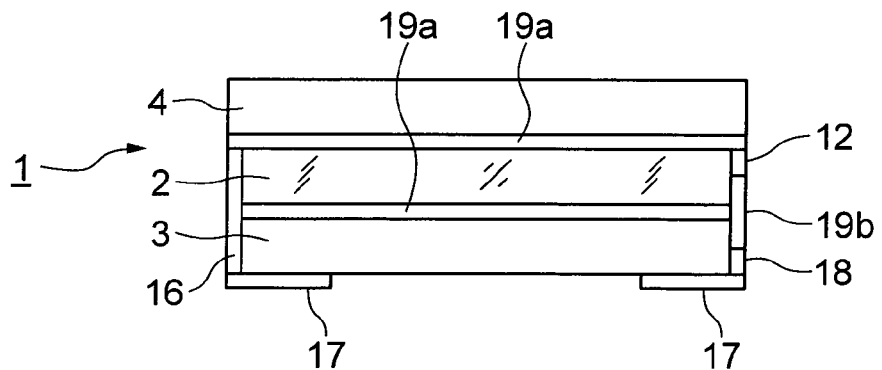
FIG. 12B is a side view thereof seen from direction A shown in FIG. 12A.
Figure 12C:
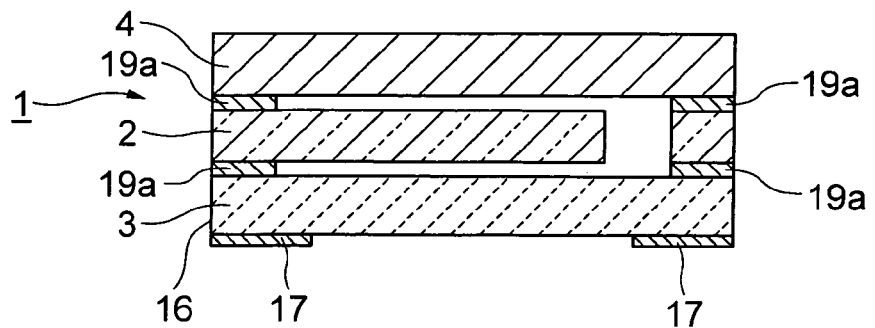
FIG. 12C is a cross-sectional view thereof taken along the line B-B shown in FIG. 12A.
Figure 13A:
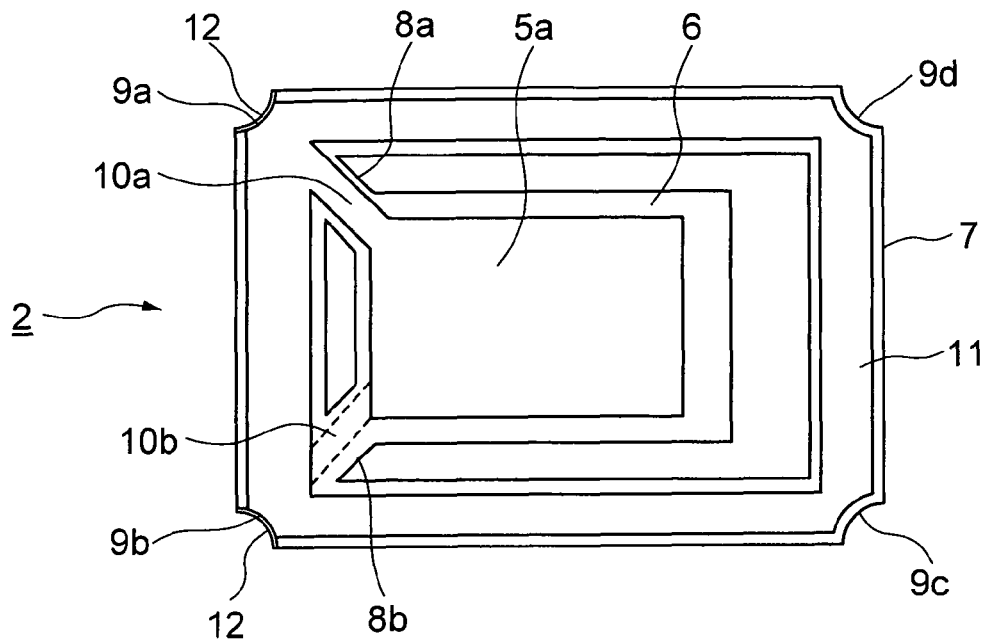
FIG. 13A is a plan view of one principle surface thereof.
Figure 13B:
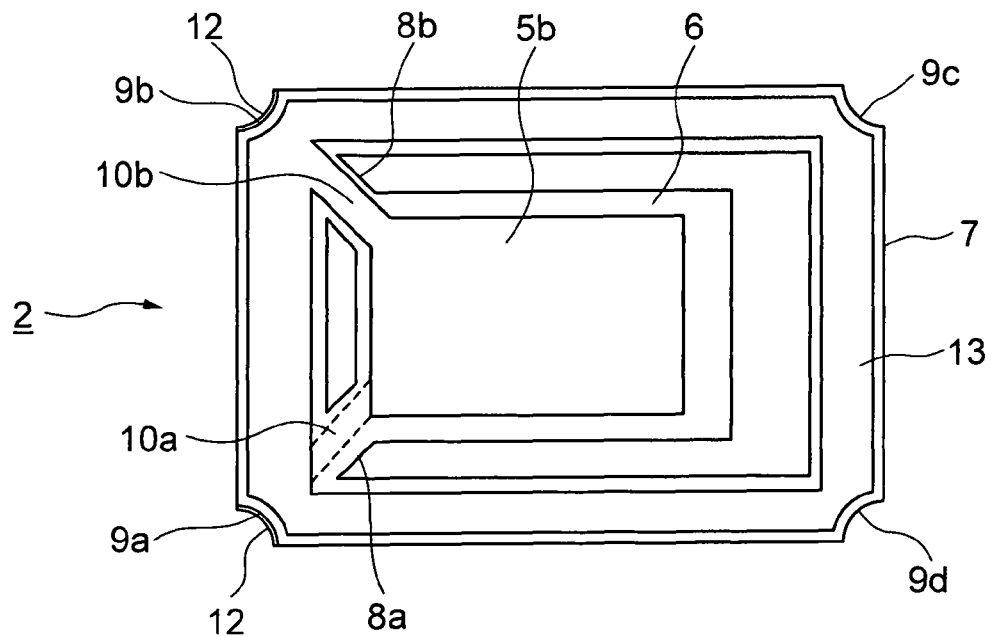
FIG. 13B is a plan view of the other principle surface thereof.
Figure 14A:
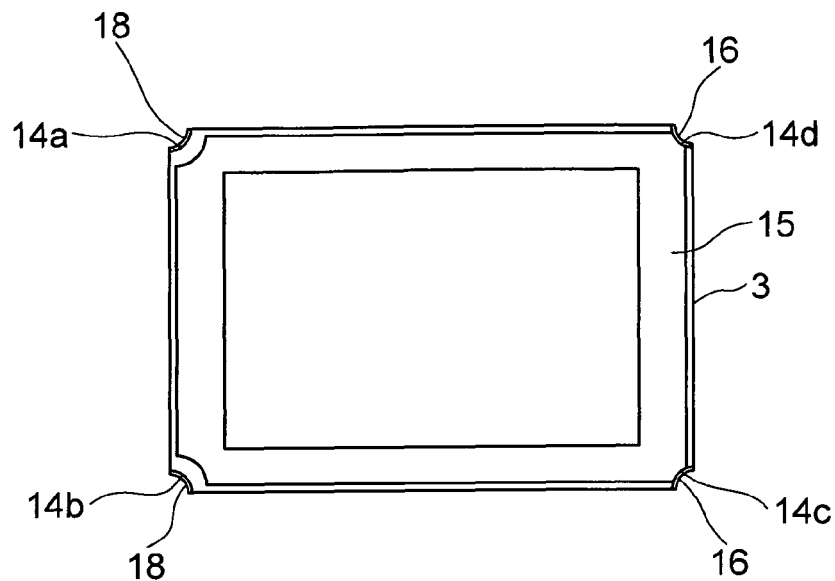
FIG. 14A is a plan view of one principle surface thereof.
Figure 14B:
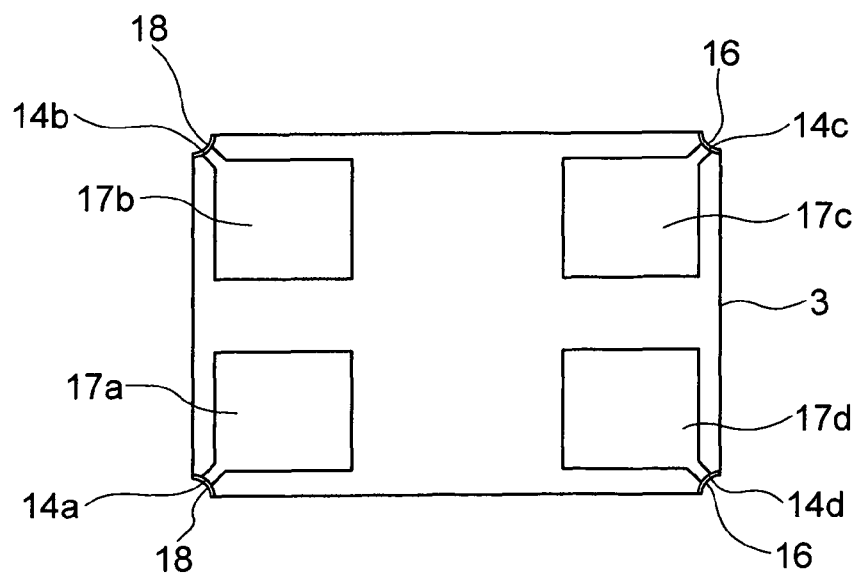
FIG. 14B is a plan view of the other principle surface thereof.

A stacked crystal resonator 1 is formed such that a ceramic-made base 3 and a metallic cover 4 are stacked on both of the principle surfaces of a framed crystal plate 2 (refer to FIG. 12). As shown in FIG. 10A and FIG. 10B, the framed crystal plate 2 includes a resonating section 6 having first and second exciting electrodes 5 (a, b) on both of the principle surfaces thereof, a frame section 7 that surrounds the resonating section 6, and first and second connecting sections 8 (a, b) that respectively extend from both sides at one end section of the resonating section 6 and that connect the resonating section 6 and the frame section 7. On one long side of the frame section 7 there are formed cutaway sections 9(a, d), and on the other long side there are formed cutaway sections 9(b, c).

The film width of the second metallic film 13 shown in FIG. 10B is, for example, 50 µM. The width of the frame section 7 on sides respectively having the cutaway sections 9a, 9d and the cutaway section 9b, 9c, is made, for example, 200 µm, because the crystal plate auxiliary electrodes 21 and the second metallic film 13 need to be formed apart from each other. Moreover, in order to miniaturize the planar outer dimension of the crystal resonator 1, the width of the frame section 7 on the other sides is made, for example, 100 µm which is close to the width of the second metallic film 13. That is to say, the width of the frame section on the side on one end side of the framed crystal plate 2 where the crystal plate auxiliary electrode 21 is formed, that is, on the side denoted by reference symbol C in FIG. 10B is made less than the width of the frame sections on the other sides C' orthogonal to this one side.

Next, the base 3 is described (refer to FIG. 11). In the long side sections of the base 3, there are formed cutaway sections 14 (a to d) respectively corresponding to the cutaway sections 9 (a to d) of the framed crystal plate 2. On one principle surface of the base that joins with the framed crystal plate 2, there are formed base auxiliary electrodes 24 that join with the crystal plate auxiliary electrodes 21 via the eutectic alloy 19 so as to face the crystal plate auxiliary electrodes 21. The base auxiliary electrodes 24 are formed on the outer periphery of the cutaway sections 14 (*a, b*), and are electrically connected to first base end surface electrodes 18 formed in the cutaway sections 14 (*a, b*). The first base end surface electrodes 18 are electrically connected to mount terminals 17 (*a, b*) that are formed in the corners of the other principle surface of the base 3 where the cutaway sections 14 (*a, b*) are present.

Moreover, on the outer periphery section of the one principle surface of the base 3, there is formed a third metallic film 15 that faces the second metallic film 13. The third metallic film 15 is electrically connected to second base end surface electrodes 16 formed in the side surface portions of the cutaway sections 14 (*c, d*). The second base end surface electrodes 16 are electrically connected to mount terminals 17 (*c, d*) that are formed in the corners of the other principle surface of the base 3 where the cutaway sections 14 (*c, d*) are present. Moreover, the third metallic film 15 is formed so as to be apart from the base auxiliary electrodes 24.

According to this type of configuration, effects similar to those in the above first embodiment can be achieved. That is to say, the blocking film 22 is provided on the conducting paths 10 (*a, b*), and therefore, the fused eutectic alloy 19 will not flow to the first and second exciting electrodes 5 (*a, b*). Furthermore, a chrome film and a gold film are present under the layer of chrome oxide, which is the blocking film 22 formed on the conducting paths 10 (*a, b*), and therefore there will be no negative effects on the resonating characteristic of the crystal resonator 1. Moreover, it is possible to avoid the possibility of electrical connection cut between the crystal plate end surface electrodes 12 and the first base end surface electrodes 18. Furthermore, it is possible to prevent an electrical short by the eutectic alloy 19 between the crystal plate auxiliary electrodes 21 and the second metallic film 13.

In the embodiments described above, a ceramic material is used for the base 3 and a metallic material is used for the cover 4. However, glass or crystal may be used for the base 3 and the cover 4. Glass and crystal can be finely processed using commonly known techniques such as photolithography techniques and etching techniques, and it is therefore effective for miniaturizing or sophisticating the crystal resonator 1.

Here, examples of the glass to be used include borosilicate glass. Here the Knoop hardness of borosilicate glass is 590 kg/mm$^2$. In contrast, the Knoop hardness of crystal is 710 to 790 kg/mm$^2$, which is higher than that of borosilicate glass. Therefore, in those cases where the base and cover are crystal made, it is possible to reduce the size and height while maintaining the strength, compared to those cases of forming them with borosilicate glass. Also, insulating materials other than crystal and glass may be used for the base and the cover.

Moreover, the outer shape of the resonating section is rectangular in the above embodiments, however, the present invention may also be applied to a framed crystal plate with a tuning fork-shaped resonating section. Metallic materials such as nickel, tungsten, aluminum, and chrome, or metal oxide films other than chrome oxide film may be used for the blocking film. Furthermore, an insulating adhesive agent may be used as the blocking film.

What is claimed is:

1. A stacked crystal resonator comprising:
   a framed crystal plate in which a frame section surrounds a resonating section having first and second exciting electrodes on both principle surfaces thereof, and said resonating section and said frame section are connected by first and second connecting sections;
   first and second metallic films which are respectively formed on the entire periphery of both of one principle surface and the other principle surface of said frame section, and to which conducting paths extending from said first and second exciting electrodes are connected via said first and second connecting sections; and
   a base and a cover which are stacked on both of the principle surfaces of said framed crystal plate, and the outer periphery section of which is joined with said frame section by a eutectic alloy so as to seal-enclose said resonating section; in which
   said first metallic film provided on the one principle surface of said framed crystal plate is electrically connected to one of a pair of mount terminals provided on one end side on the other principle surface, which is an opposite surface of one principle surface of said base, by a crystal plate end surface electrode formed in a cutaway section provided on the outer side surface of said framed crystal plate, and by a first base end surface electrode formed in a cutaway section provided on the outer side surface of said base; and
   said second metallic film provided on the other principle surface of said framed crystal plate is electrically connected to the other mount terminal provided on the other end side on the other principle surface of said base, by a third metallic film provided on the outer periphery of the one principle surface of said base, which joins with the framed crystal plate across its entire surface via said eutectic alloy, and by a second base end surface electrode which connects to said third metallic film and which is formed in a cutaway section provided on the outer side surface of said base, wherein;
   said crystal plate end surface electrode which is electrically connected to said first metallic film on the one principle surface of said framed crystal plate, is electrically connected to a crystal plate auxiliary electrode which is provided on the outer periphery of the cutaway section on the surface of the other principle surface of said framed crystal plate so as to be apart from said second metallic film, and said crystal plate auxiliary electrode faces and electrically connects via said eutectic alloy to a base auxiliary electrode provided on the one principle surface of said base;
   the width of the frame section of said framed crystal plate on one side on the one end side where said crystal plate auxiliary electrode is formed, differs from the width of the frame section at least on one other side; and
   on said conducting paths there is provided a blocking film which blocks flow of said eutectic alloy to said exciting electrodes.

2. A stacked crystal resonator according to claim 1, wherein the width of the frame section of said framed crystal plate of one side on the one end side where said crystal plate auxiliary electrode is formed, is greater than the width of the frame section of another side on the other end side.

3. A stacked crystal resonator according to claim 2, wherein said one and other mount terminals are two terminals, in which one of each terminal is arranged on both end sides of one same side.

4. A stacked crystal resonator according to claim 2, wherein said one and other mount terminals are four terminals, in which two of these terminals are respectively arranged on both sides of one same side.

5. A stacked crystal resonator according to claim 1, wherein said one and other mount terminals are four terminals, two of which terminals are respectively provided on both sides of the same one side, and are of a configuration in which the width of the frame section of one side on one end side of said framed crystal plate where said crystal plate auxiliary electrode is formed, is smaller than the width of the frame section of another side orthogonal to said one side.

6. A stacked crystal resonator according to claim 1, wherein said blocking film is composed of a metal oxide film formed on said conducting paths.

* * * * *